(12) United States Patent
Likhanskii et al.

(10) Patent No.: US 11,810,746 B2
(45) Date of Patent: Nov. 7, 2023

(54) VARIABLE THICKNESS ION SOURCE EXTRACTION PLATE

(71) Applicant: Applied Materials, Inc., Santa Clara, CA (US)

(72) Inventors: Alexandre Likhanskii, Middleton, MA (US); Alexander S. Perel, Danvers, MA (US); Jay T. Scheuer, Rowley, MA (US); Bon-Woong Koo, Andover, MA (US); Robert C. Lindberg, Rockport, MA (US); Peter F. Kurunczi, Cambridge, MA (US); Graham Wright, Newburyport, MA (US)

(73) Assignee: Applied Materials, Inc., Santa Clara, CA (US)

( * ) Notice: Subject to any disclaimer, the term of this patent is extended or adjusted under 35 U.S.C. 154(b) by 204 days.

(21) Appl. No.: 17/473,096

(22) Filed: Sep. 13, 2021

(65) Prior Publication Data

US 2023/0080083 A1 Mar. 16, 2023

(51) Int. Cl.
*H01J 27/02* (2006.01)
*H01J 37/08* (2006.01)

(52) U.S. Cl.
CPC ............ *H01J 27/024* (2013.01); *H01J 37/08* (2013.01); *H01J 2237/0455* (2013.01); *H01J 2237/061* (2013.01); *H01J 2237/327* (2013.01)

(58) Field of Classification Search
CPC .... H01J 27/02; H01J 27/024; H01J 2237/061; H01J 27/14; H01J 27/12; H01J 37/08
See application file for complete search history.

(56) References Cited

U.S. PATENT DOCUMENTS

| 5,026,997 A | 6/1991 | Benveniste |
| 10,325,752 B1 * | 6/2019 | Calkins ................... H01J 37/08 |

(Continued)

FOREIGN PATENT DOCUMENTS

| JP | 2961326 B2 | 10/1999 | |
| JP | 3982402 B2 * | 9/2007 | .......... H01J 37/3244 |

(Continued)

OTHER PUBLICATIONS

International Search Report and Written Opinion dated Dec. 9, 2022 in corresponding PCT application No. PCT/US2022/040772.

*Primary Examiner* — Abdullah A Riyami
*Assistant Examiner* — Syed M Kaiser
(74) *Attorney, Agent, or Firm* — NIELDS, LEMACK & FRAME, LLC

(57) ABSTRACT

An ion source having an extraction plate with a variable thickness is disclosed. The extraction plate has a protrusion on its interior or exterior surface proximate the extraction aperture. The protrusion increases the thickness of the extraction aperture in certain regions. This increases the loss area in those regions, which serves as a sink for ions and electrons. In this way, the plasma density is decreased more significantly in the regions where the extraction aperture has a greater thickness. The shape of the protrusion may be modified to achieve the desired plasma uniformity. Thus, it may be possible to create an extracted ion beam having a more uniform ion density. In some tests, the uniformity of the beam current along the width direction was improved by between 20% and 50%.

28 Claims, 10 Drawing Sheets

(56) References Cited

U.S. PATENT DOCUMENTS

| | | | |
|---|---|---|---|
| 2009/0215205 A1* | 8/2009 | Takagi | H01J 37/32935 438/16 |
| 2016/0111250 A1* | 4/2016 | Sato | H01J 37/08 313/153 |
| 2020/0194219 A1* | 6/2020 | Heres | H01J 37/3171 |
| 2020/0294750 A1 | 9/2020 | Radovanov et al. | |

FOREIGN PATENT DOCUMENTS

| | | | | |
|---|---|---|---|---|
| KR | 20110121677 A | * | 7/2007 | H01J 37/3244 |
| WO | 2019/089191 A1 | | 5/2019 | |

* cited by examiner

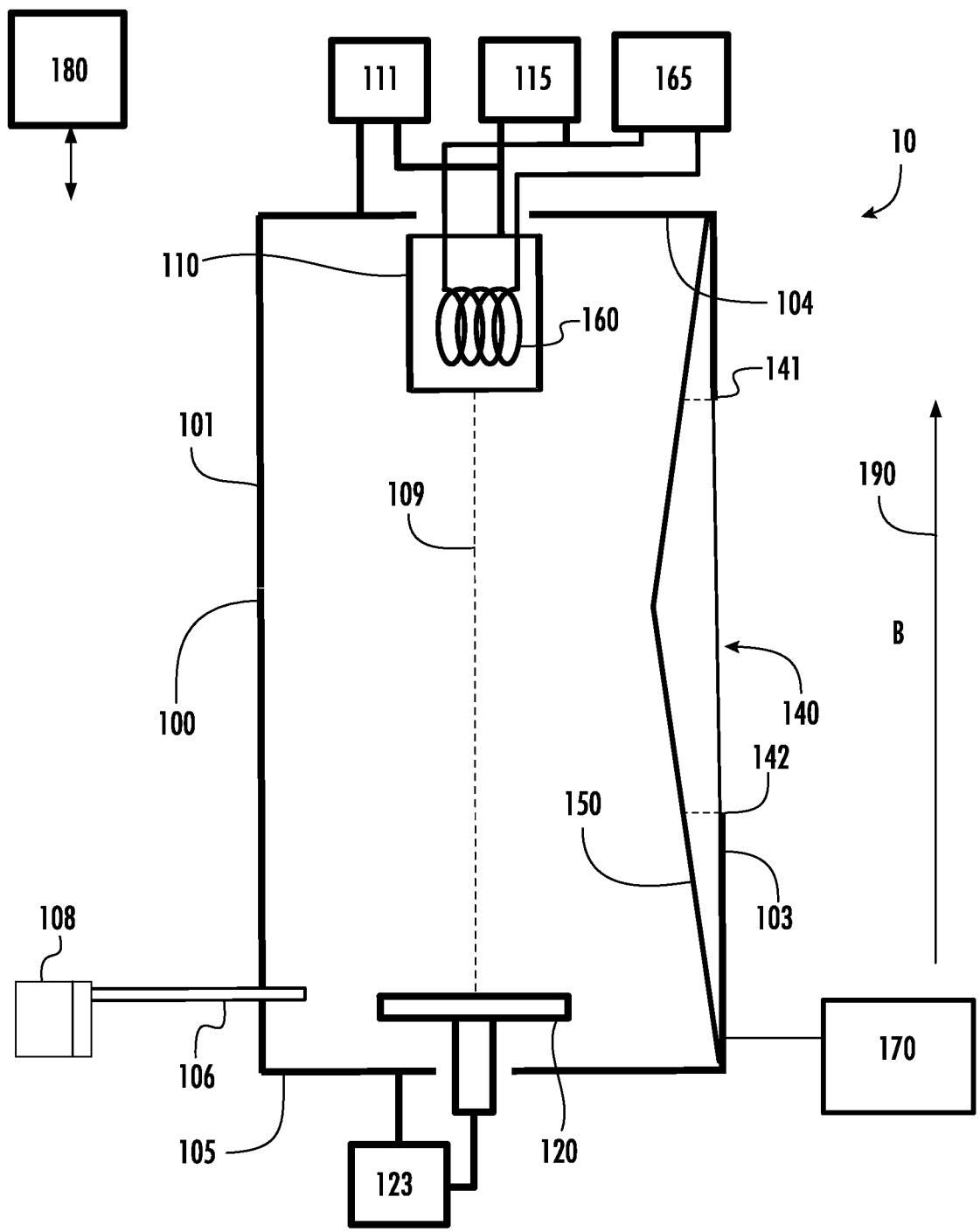
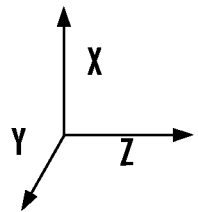

VARIABLE THICKNESS ION SOURCE EXTRACTION PLATE

This disclosure describes systems for improving the uniformity of a ribbon ion beam extracted from an ion source, and more particularly from an indirectly heated cathode (IHC) ion source.

BACKGROUND

Semiconductor devices are fabricated using a plurality of processes, some of which implant ions into the workpiece. Various ion sources may be used to create the ions. One such mechanism is an indirectly heated cathode (IHC) ion source. An IHC ion source comprises a filament disposed behind a cathode. The cathode may be maintained at a more positive voltage than the filament. As current is passed through the filament, the filament emits thermionic electrons, which are accelerated toward the more positively charged cathode. These thermionic electrons serve to heat the cathode, in turn causing the cathode to emit electrons into the chamber of the ion source. The cathode is disposed at one end of a chamber. A repeller is typically disposed on the end of the chamber opposite the cathode.

In certain embodiments, the ion source is configured to extract a ribbon ion beam, where a width of the ribbon ion beam is much larger than the height of the ribbon ion beam. Unfortunately, in many systems, the beam current of the extracted ribbon ion beam is not uniform along its width. This non-uniformity may cause uneven concentrations of ions implanted into the workpiece. In other embodiments, additional components in the beam line, such as quadrupole lenses, may be utilized to try to compensate for this non-uniformity. These remedies may add additional complexity and cost to the beam line system.

Therefore, it would be beneficial if there was a system that could improve the uniformity of a ribbon ion beam being extracted from an ion source. Further, it would be advantageous if this system could be readily adopted for existing ion sources.

SUMMARY

An ion source having an extraction plate with a variable thickness is disclosed. The extraction plate has a protrusion on its interior or exterior surface proximate the extraction aperture. The protrusion increases the thickness of the extraction aperture in certain regions. This increases the loss area in those regions, which serves as a sink for ions and electrons. In this way, the plasma density is decreased more significantly in the regions where the extraction aperture has a greater thickness. The shape of the protrusion may be modified to achieve the desired plasma uniformity. Thus, it may be possible to create an extracted ion beam having a more uniform ion density. In some tests, the uniformity of the beam current along the width direction was improved by between 20% and 50%.

According to one embodiment, an ion source is disclosed. The ion source comprises a chamber comprising a first end, a second end and a plurality of walls connecting the first end and the second end, wherein one of the plurality of walls is an extraction plate having an extraction aperture having a width greater than its height; and a plasma generator to generate a plasma within the chamber; wherein a thickness of the extraction aperture varies as a function of the width of the extraction aperture. In some embodiments, the extraction plate comprises a protrusion to vary the thickness of the extraction aperture. In certain embodiments, the protrusion extends from an interior surface of the extraction plate at least 1 mm into the chamber at at least one location. In certain embodiments, the protrusion extends outward from an exterior surface of the extraction plate at least 1 mm at at least one location. In some embodiments, the protrusion comprises a constant radius of curvature from the first end to the second end. In some embodiments, the protrusion comprises a triangular shape. In some embodiments, the protrusion comprises a trapezoidal shape. In certain embodiments, a maximum thickness of the protrusion occurs at a center of the extraction aperture in a width direction. In some embodiments, the extraction aperture passes through the protrusion, and edges of the extraction aperture are tapered in a height direction such that a height of the extraction aperture inside the chamber is larger than the height of the extraction aperture at an exterior surface of the extraction plate. In certain embodiments, the extraction aperture passes through the protrusion, and edges of the extraction aperture are such that a height of the extraction aperture inside the chamber is equal to the height of the extraction aperture at an exterior surface of the extraction plate. In some embodiments, the protrusion above the extraction aperture in a height direction has a different thickness than the protrusion below the extraction aperture in the height direction. In some embodiments, the protrusion is only disposed on one side of the extraction aperture in a height direction. In some embodiments, the plasma generator comprises an indirectly heated cathode disposed at the first end.

According to another embodiment, an extraction plate for use with an ion source is disclosed. The extraction plate comprises an interior surface adapted to be within a chamber, an exterior surface and an extraction aperture having a width greater than its height; wherein a thickness of the extraction aperture varies as a function of the width of the extraction aperture. In certain embodiments, the extraction plate comprises a protrusion on the interior surface or the exterior surface. In certain embodiments, a maximum thickness of the protrusion occurs at a center of the extraction aperture in a width direction. In some embodiments, the extraction aperture passes through the protrusion, and edges of the extraction aperture are tapered in a height direction such that a height of the extraction aperture inside the chamber is larger than the height of the extraction aperture at an exterior surface of the extraction plate. In some embodiments, the extraction aperture passes through the protrusion, and edges of the extraction aperture are such that a height of the extraction aperture inside the chamber is equal to the height of the extraction aperture at the exterior surface of the extraction plate. In some embodiments, the protrusion above the extraction aperture in a height direction has a different thickness than the protrusion below the extraction aperture in the height direction. In certain embodiments, the protrusion is only disposed on one side of the extraction aperture in a height direction.

BRIEF DESCRIPTION OF THE DRAWINGS

For a better understanding of the present disclosure, reference is made to the accompanying drawings, in which like elements are referenced with like numerals, and in which:

FIGS. 3A-3E are block diagrams of an IHC ion source according to different embodiments;

DETAILED DESCRIPTION

Figure 1:
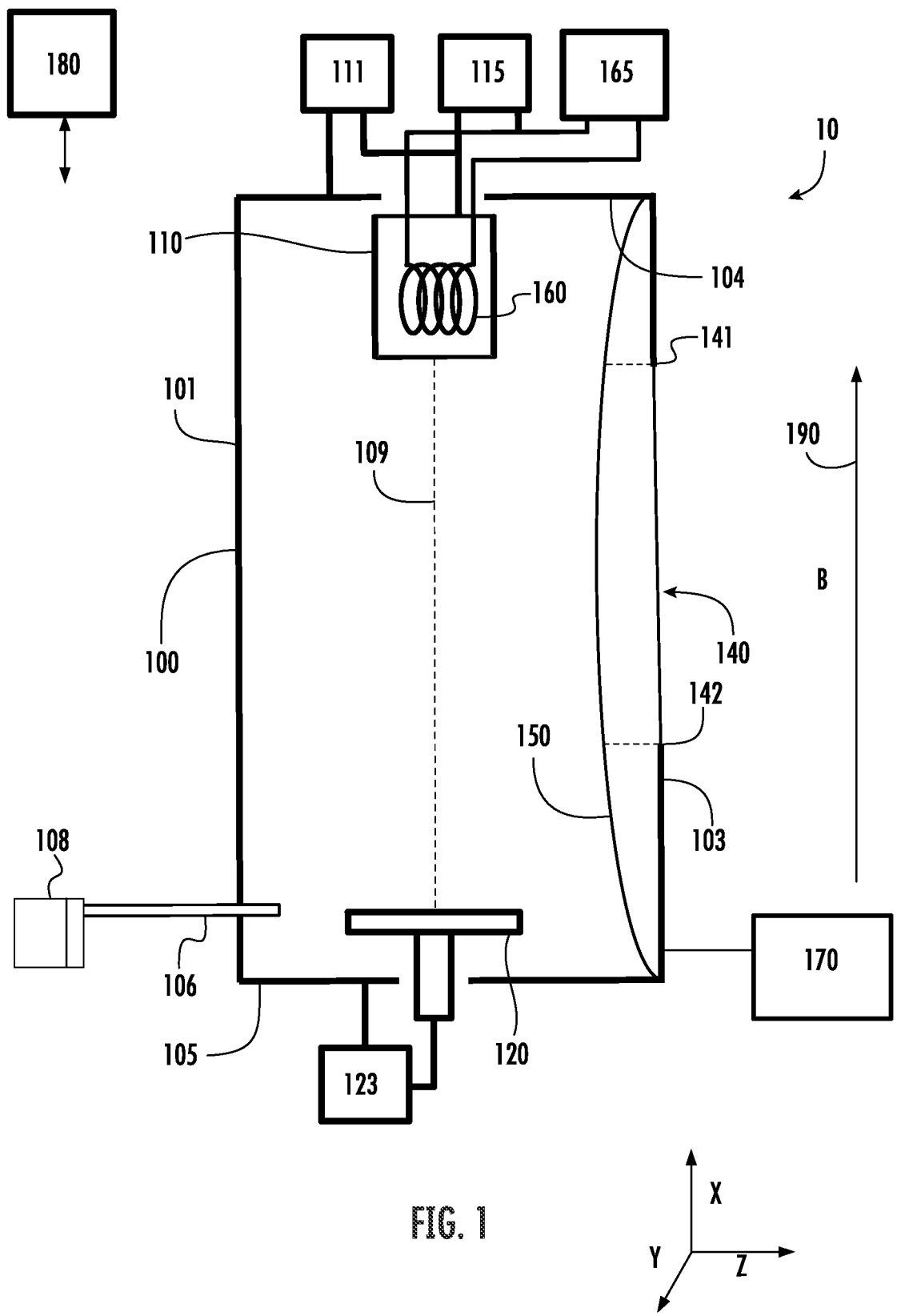
FIG. 1 is a block diagram showing an IHC ion source according to one embodiment.

FIG. 1 shows an IHC ion source 10 that may be utilized to extract a ribbon ion beam with improved uniformity. The IHC ion source 10 includes a chamber 100, comprising two opposite ends, and walls 101 connecting to these ends. These walls 101 include side walls, an extraction plate 103 and a bottom wall opposite the extraction plate 103. The extraction plate 103 has a height, width and a thickness. The extraction plate 103 includes an extraction aperture 140 that passes through the extraction plate 103 in the thickness direction. Ions are extracted through the extraction aperture 140. The extraction aperture 140 may be much larger in the width direction, also referred to as the X direction, than in the height direction, also referred to as the Y direction. The Z direction is defined along the thickness of the extraction plate 103 and is defined as the direction of travel for the ribbon ion beam. For example, the extraction aperture 140 may be greater than 3 inches in the width direction and less than 0.3 inches in the height direction.

The walls 101 of the chamber 100 may be constructed of an electrically conductive material and may be in electrical communication with one another. A cathode 110 is disposed in the chamber 100 at a first end 104 of the chamber 100. A filament 160 is disposed behind the cathode 110. The filament 160 is in communication with a filament power supply 165. The filament power supply 165 is configured to pass a current through the filament 160, such that the filament 160 emits thermionic electrons. Cathode bias power supply 115 biases filament 160 negatively relative to the cathode 110, so these thermionic electrons are accelerated from the filament 160 toward the cathode 110 and heat the cathode 110 when they strike the back surface of cathode 110. The cathode bias power supply 115 may bias the filament 160 so that it has a voltage that is between, for example, 200V to 1500V more negative than the voltage of the cathode 110. The cathode 110 then emits thermionic electrons from its front surface into chamber 100.

Thus, the filament power supply 165 supplies a current to the filament 160. The cathode bias power supply 115 biases the filament 160 so that it is more negative than the cathode 110, so that electrons are attracted toward the cathode 110 from the filament 160. The cathode 110 is in communication with an arc voltage power supply 111. The arc voltage power supply 111 supplies a voltage to the cathode relative to the chamber 100. This arc voltage accelerates the thermionic electrons emitted at the cathode into chamber 100 to ionize the neutral gas. The current drawn by this arc voltage power supply 111 is a measurement of the amount of current being driven through the plasma. In certain embodiments, the walls 101 provide the ground reference for the other power supplies.

In this embodiment, a repeller 120 may be disposed in the chamber 100 on the second end 105 of the chamber 100 opposite the cathode 110. The center of the cathode 110 and the center of the repeller 120 may form two points on the central axis 109 of the chamber 100.

The repeller 120 may be in electrical communication with a repeller power supply 123. As the name suggests, the repeller 120 serves to repel the electrons emitted from the cathode 110 back toward the center of the chamber 100. For example, in certain embodiments, the repeller 120 may be biased at a negative voltage relative to the chamber 100 to repel the electrons. For example, in certain embodiments, the repeller 120 is biased at between 0 and −150V relative to the chamber 100. In certain embodiments, the repeller 120 may be floated relative to the chamber 100. In other words, when floated, the repeller 120 is not electrically connected to the repeller power supply 123 or to the chamber 100. In this embodiment, the voltage of the repeller 120 tends to drift to a voltage close to that of the cathode 110. Alternatively, the repeller 120 may be electrically connected to the walls 101.

In certain embodiments, a magnetic field 190 is generated in the chamber 100. This magnetic field is intended to confine the electrons along one direction. The magnetic field 190 typically runs parallel to the walls 101 from the first end 104 to the second end 105. For example, electrons may be confined in a column that is parallel to the direction from the cathode 110 to the repeller 120 (i.e. the x direction). Thus, electrons do not experience electromagnetic force to move in the x direction. However, movement of the electrons in other directions may experience an electromagnetic force.

One or more gas containers 108 may be in communication with the chamber 100 via a gas inlet 106. Each gas container 108 may include a mass flow controller (MFC) so as to regulate a flow of gas from each gas container.

An extraction power supply 170 may be used to bias the walls 101 of the IHC ion source 10 relative to the rest of the components in the beam line. For example, the platen 260 (see FIG. 2) may be at a first voltage, such as ground, while a positive voltage is applied to the IHC ion source 10 such that the IHC ion source 10 is more positively biased than the platen 260. Thus, the voltage supplied by the extraction power supply 170, referred to as the extraction voltage, determines the energy of the ions that are extracted from the IHC ion source 10. Further, the current supplied by the extraction power supply 170 is a measure of the total extracted beam current.

In certain embodiments, there is a feedback loop between the cathode bias power supply 115 and the extraction power supply 170. Specifically, it may be desirable to maintain the extracted beam current at a constant value. Thus, the current supplied from the extraction power supply 170 may be monitored and the output of the cathode bias power supply 115 may be adjusted to maintain a constant extraction current. This feedback loop may be performed by the controller 180, or may be performed in another manner.

A controller 180 may be in communication with one or more of the power supplies such that the voltage or current supplied by these power supplies may be monitored and/or modified. Additionally, the controller 180 may be in communication with the MFCs of each gas container 108 so as to regulate a flow of each gas into the chamber 100. The controller 180 may include a processing unit, such as a microcontroller, a personal computer, a special purpose controller, or another suitable processing unit. The controller 180 may also include a non-transitory storage element, such as a semiconductor memory, a magnetic memory, or another suitable memory. This non-transitory storage element may contain instructions and other data that allows the controller 180 to perform the functions described herein. For example, the controller 180 may be in communication with the cathode bias power supply 115 to allow the IHC ion source 10 to vary the voltage applied to the cathode relative to the filament 160. The controller 180 may also be in communication with the repeller power supply 123 to bias the repeller. Further, the controller 180 may be able to monitor the voltage, current and/or power supplied by the cathode bias power supply 115.

Figure 2:
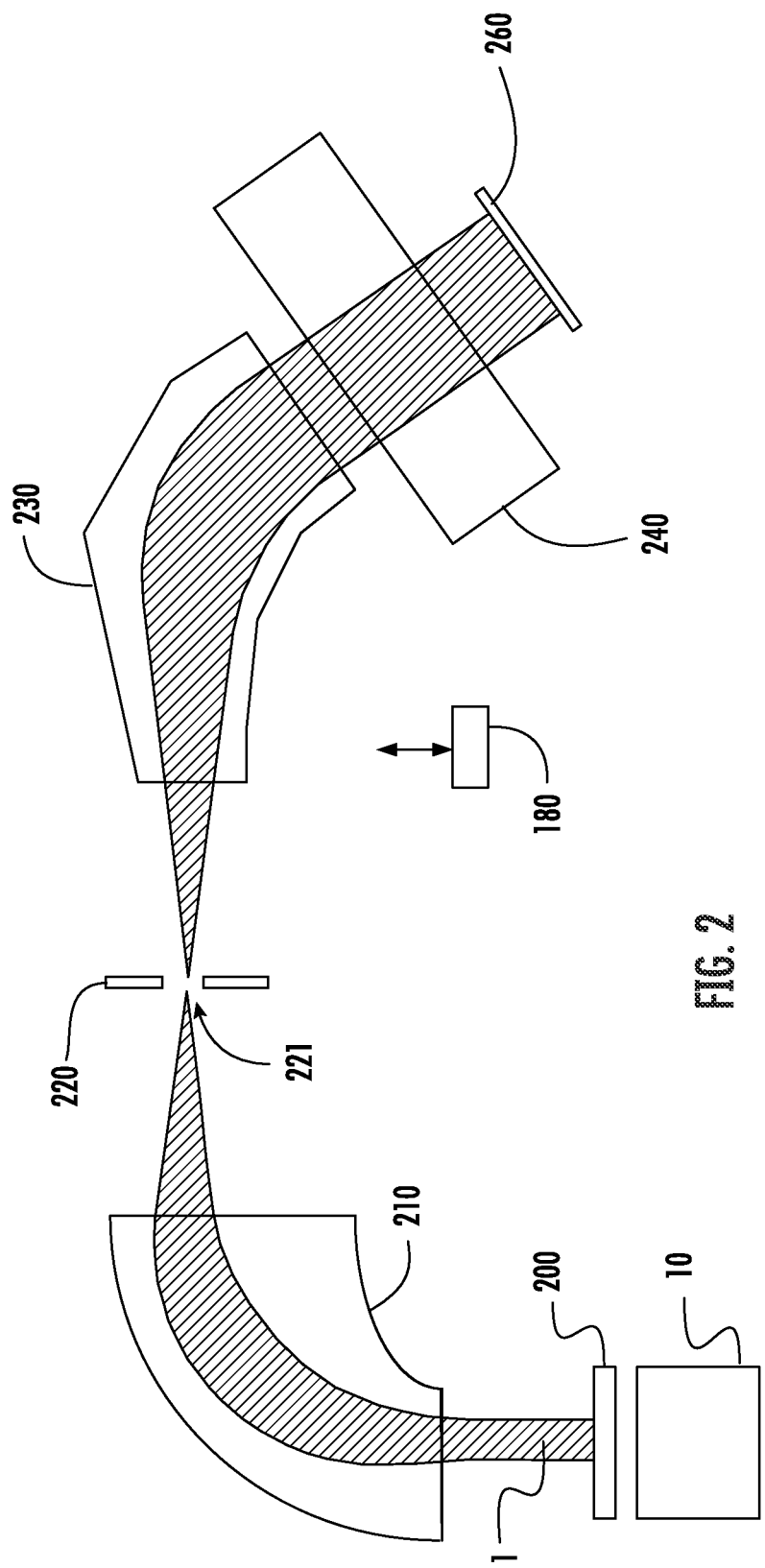
FIG. 2 is a block of an ion implantation system that uses the IHC ion source of FIG. 1.

FIG. 2 shows an ion implantation system using the IHC ion source 10 of FIG. 1. Disposed outside and proximate the extraction aperture of the IHC ion source 10 are one or more electrodes 200.

Located downstream from the electrodes 200 is a mass analyzer 210. The mass analyzer 210 uses magnetic fields to guide the path of the extracted ribbon ion beam 1. The magnetic fields affect the flight path of ions according to their mass and charge. A mass resolving device 220 that has a resolving aperture 221 is disposed at the output, or distal end, of the mass analyzer 210. By proper selection of the magnetic fields, only those ions in the ribbon ion beam 1 that have a selected mass and charge will be directed through the resolving aperture 221. Other ions will strike the mass resolving device 220 or a wall of the mass analyzer 210 and will not travel any further in the system.

A collimator 230 may disposed downstream from the mass resolving device 220. The collimator 230 accepts the ions from the ribbon ion beam 1 that pass through the resolving aperture 221 and creates a ribbon ion beam formed of a plurality of parallel or nearly parallel beamlets. The output, or distal end, of the mass analyzer 210 and the input, or proximal end, of the collimator 230 may be a fixed distance apart. The mass resolving device 220 is disposed in the space between these two components.

Located downstream from the collimator 230 may be an acceleration/deceleration stage 240. The acceleration/deceleration stage 240 may be referred to as an energy purity module. The energy purity module is a beam-line lens component configured to independently control deflection, deceleration, and focus of the ion beam. For example, the energy purity module may be a vertical electrostatic energy filter (VEEF) or electrostatic filter (EF). Located downstream from the acceleration/deceleration stage 240 is a platen 260. The workpiece is disposed on the platen 260 during processing.

Returning to FIG. 1, in this embodiment, the extraction plate 103 has a varying thickness, wherein the extraction plate 103 protrudes inward from the interior surface that faces the chamber 100. In other words, the protrusion 150 extends into the chamber from the interior surface of the extraction plate 103 and causes the thickness of the extraction plate 103 to vary. This protrusion 150 affects the thickness of the extraction aperture 140, which in turn affects the loss area disposed in the extraction aperture 140. The thickness of the extraction aperture 140 is defined as the distance between the interior surface of the extraction plate 103 and the exterior surface of the extraction plate 103 for a particular location in the width direction. The thickness of the extraction aperture 140 may vary across the X, or width, direction.

The protrusion 150 is electrically conductive and is in electrical communication with the walls of the chamber 100. Thus, as the ions are being extracted from the chamber 100 through the extraction aperture 140, the protrusion 150 may increase the regions of the extraction plate 103 that serve as a sink for free electrons and ions. Regions of the extraction aperture 140 that are thicker (i.e. greater in the Z direction) may have a larger loss area and therefore may neutralize more ions than regions of the extraction aperture 140 that are thinner. In this way, the plasma density in the extraction aperture 140 proximate the protrusion 150 may be reduced as compared to regions with a thinner protrusion or no protrusion. As an example, in certain embodiments, the plasma density near the center of the chamber 100 may be the greatest. By introducing a protrusion 150 in this area, the extraction aperture 140 near the center of the chamber 100 may be thicker than other portions of the extraction aperture 140 and the plasma density may be decreased in this area.

Thus, in certain embodiments, the protrusion 150 extends inward from the interior surface of the extraction plate 103 into the chamber 100. However, the exterior surface of the extraction plate 103 that faces away from the chamber 100 may be unchanged and may remain planar. More specifically, in this embodiment, the protrusion 150 extends in the −Z direction. Further, the thickness of the protrusion 150 (measured in the Z direction) may vary as a function of the position in the width direction (i.e. the X direction). For example, the thickness of the extraction plate 103 may be thickest at the center of the extraction aperture 140, and decrease moving away from the center toward the first end 104 and toward the second end 105. The term "center of the extraction aperture" as used herein, refers to the center of the extraction aperture in the X or width direction.

In certain embodiments, the maximum difference between the thinnest part of the extraction plate 103 and the thickest part of the extraction plate may be between 1 and 5 mm. In other words, the protrusion may extend into the chamber 100 by at least 1 mm. Of course, other dimensions may be used in other embodiments. In other words, the thickness of the extraction aperture 140, through which the ions pass, may vary.

Figure 3A:
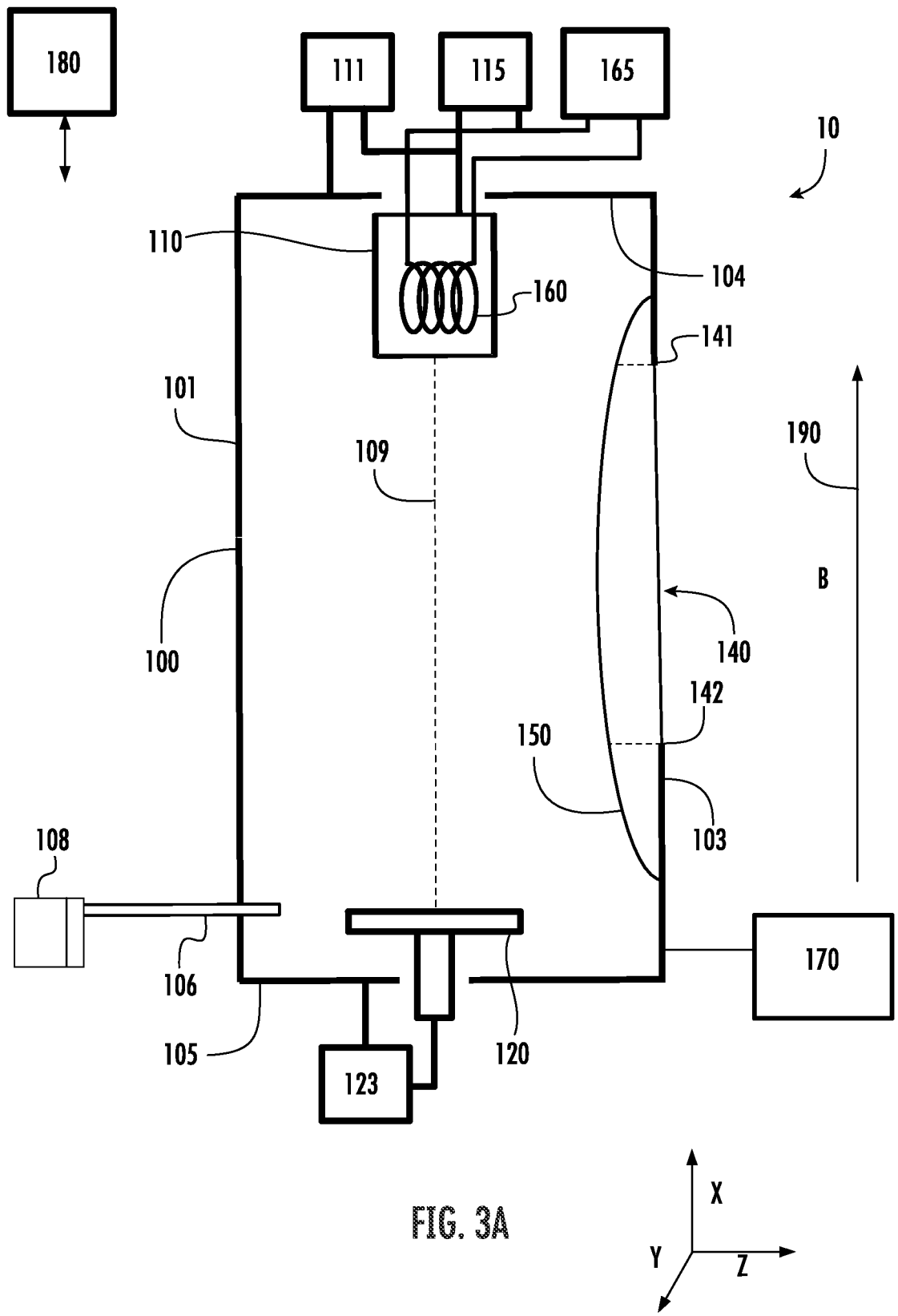

In certain embodiments, the protrusion 150 may have a smooth radius of curvature along the X direction, similar to that shown in FIG. 1. However, other curvatures are also possible. For example, there may be a first radius of curvature between the first end 104 and the center of the extraction aperture 140 and a second radius of curvature between the second end 105 and the center of the extraction aperture 140. Furthermore, while FIG. 1 shows the protrusion 150 extending to the first end 104 and the second end 105, in other embodiments, the protrusion 150 may be smaller in the width direction, such that the protrusion 150 begins at a location between the first end 104 and the first edge 141 of the extraction aperture 140 and ends at a location between the second edge 142 of the extraction aperture 140 and the second end 105, as shown in FIG. 3A.

Further, the protrusion 150 may have other shapes. For example, as shown in FIG. 3B, the protrusion 150 may appear as a triangular shape, where the thickness of the extraction plate 103 increases linearly from the first end 104 to the center of the extraction aperture 140 and from the second end 105 to the center of the extraction aperture 140. In another embodiment, the protrusion 150 begins at a location between the first end 104 and the first edge 141 of the extraction aperture 140 and ends at a location between the second edge 142 of the extraction aperture 140 and the second end 105.

Figure 3C:
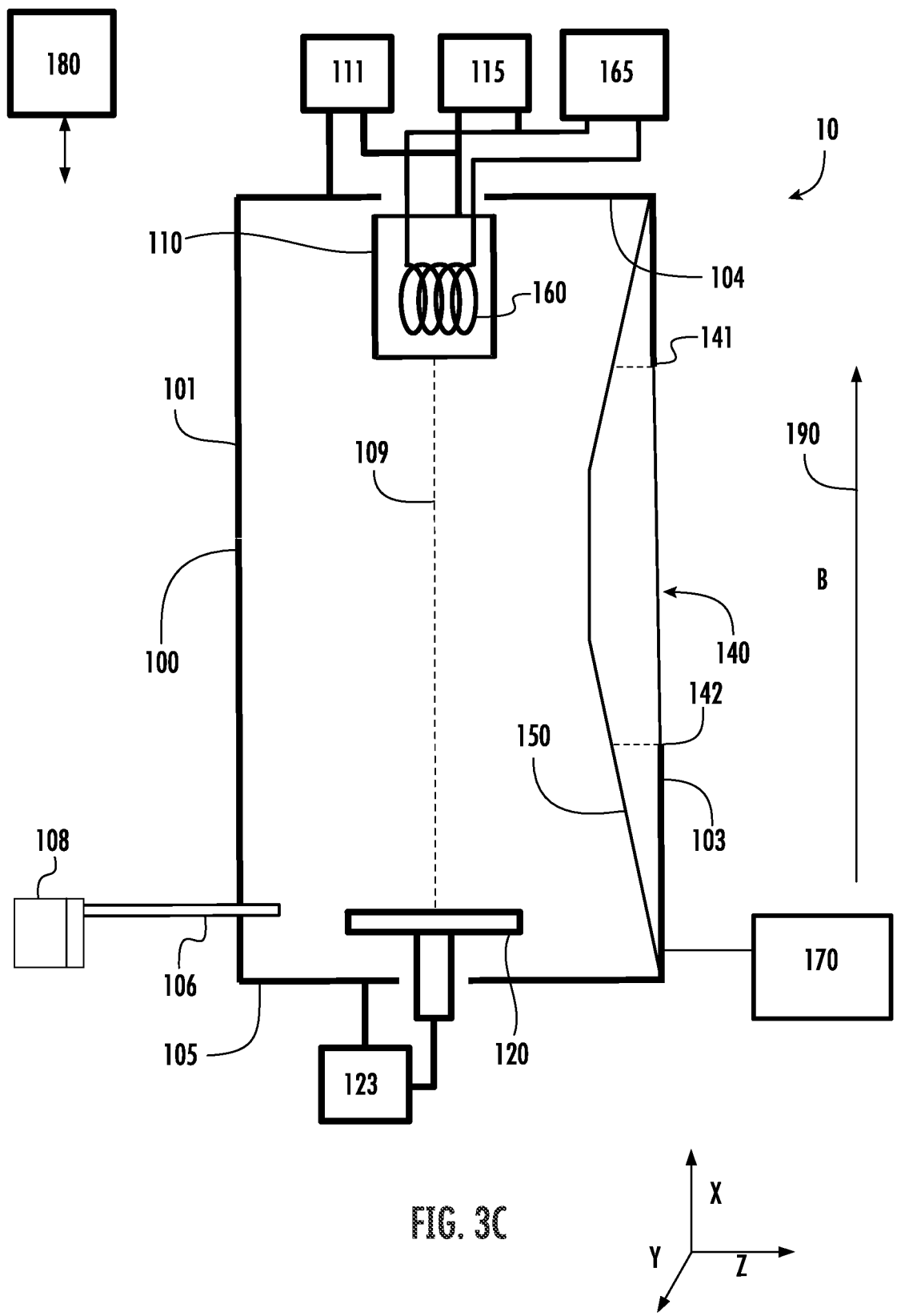

Alternatively, the protrusion 150 may be trapezoidal, where the thickness of the extraction plate 103 increases linearly from the first end 104 and from the second end 105 to a flat region located near the center of the extraction aperture 140, as shown in FIG. 3C. In another embodiment, the protrusion 150 begins at a location between the first end 104 and the first edge 141 of the extraction aperture 140 and ends at a location between the second edge 142 of the extraction aperture 140 and the second end 105.

Figure 4A:
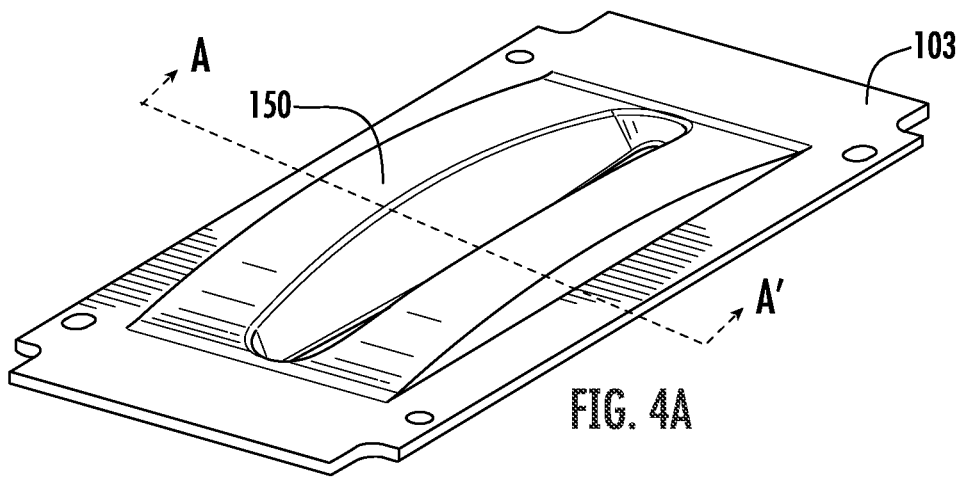
FIGS. 4A-4B are perspective and cross-sectional views, respectively, of the extraction plate according to one embodiment.
Figure 4B:
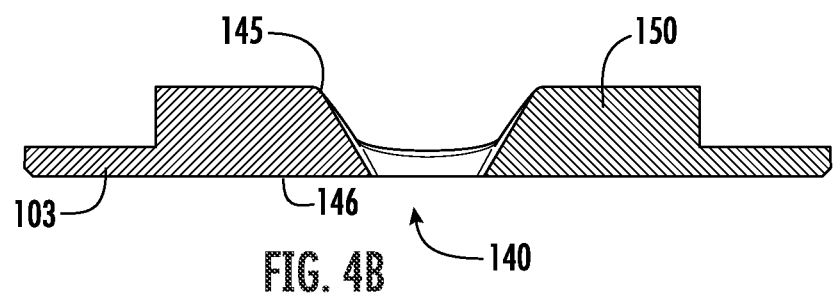

FIG. 4A shows a perspective view of the interior surface of the extraction plate 103 according to one embodiment. FIG. 4B shows a cross section view of this extraction plate 103 taken along line A-A'. In this embodiment, the protrusion 150 begin at the first end 104 and extends to the second end 105. Further, the protrusion 150 has a constant radius of curvature throughout the width direction.

In this embodiment, as best seen in FIG. 4B, the protrusion 150 is tapered from the exterior surface to the interior surface along the extraction aperture 140 in the Y, or height, direction. In other words, the extraction aperture 140 is taller in the height direction at the interior surface 145 of the extraction aperture 140 than at the exterior surface 146. In some embodiments, the slope of the taper is constant along the width of the extraction aperture 140. In other embodiments, the slope of the taper may vary as a function of width. For example, in FIG. 4A, the slope near the center of the extraction aperture 140 may be less steep that the slope near the first edge 141 and the second edge 142. In fact, near the edges, the taper may be perpendicular or nearly perpendicular to the exterior surface of the extraction plate 103.

Figure 4C:
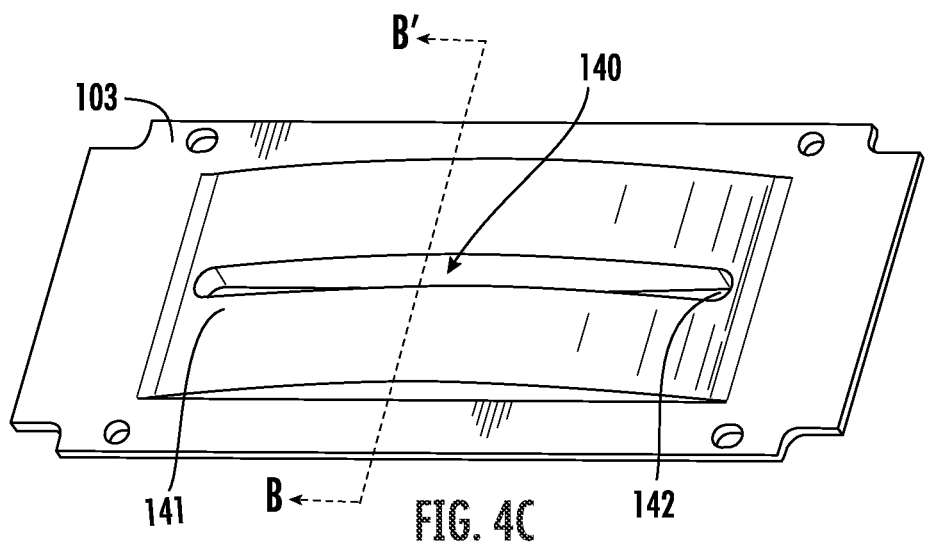
FIGS. 4C-4D are perspective and cross-sectional views, respectively, of the extraction plate according to another embodiment.
Figure 4D:
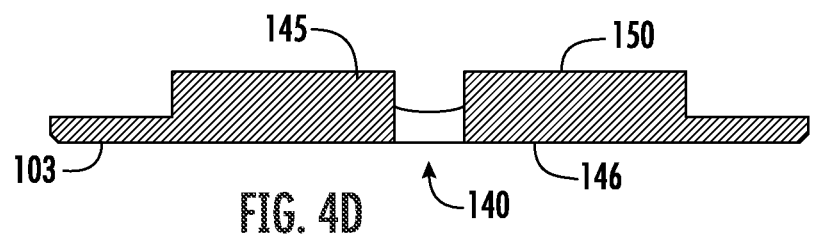

FIG. 4C shows a perspective view of the interior surface of the extraction plate 103 according to another embodiment. FIG. 4D shows a cross sectional view of this extraction plate 103 taken along line B-B'. In this embodiment, the height of the extraction aperture 140 in the Y direction remains constant along the Z direction. In other words, as best seen in FIG. 4D, the top and bottom edges of the extraction aperture 140 are perpendicular to the planar exterior surface. Thus, the height of the extraction aperture 140 at the interior surface 145 is equal to the height of the extraction aperture 140 at the exterior surface 146.

Figure 5A:
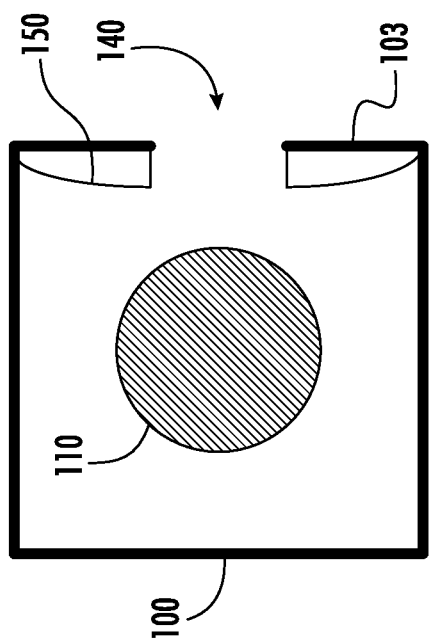
FIGS. 5A-5B are cross-sectional views of an IHC ion source according to different embodiments.
Figure 5B:
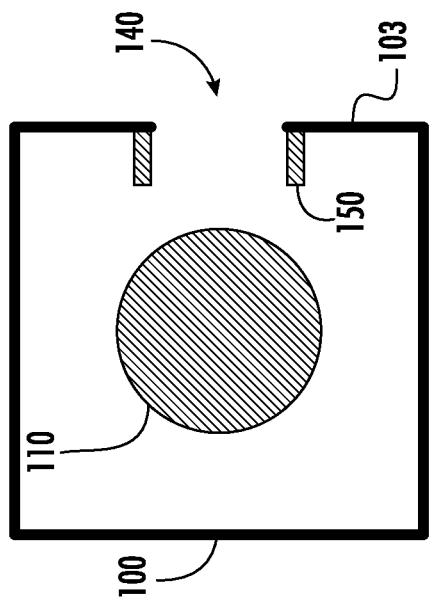

While FIGS. 4A-4D show the protrusion 150 existing on both sides of the extraction aperture 140 in the height direction, other embodiments are also possible. For example, in certain embodiments, the protrusion 150 is only disposed on one side of the extraction aperture in the height direction, as shown in FIG. 5A. FIGS. 5A-5B represent cross-sectional views of the chamber 100. In other words, the extraction aperture 140 divides the extraction plate 103 in the height direction. Thus, in some embodiments, the protrusion 150 is disposed on the portion of the extraction plate 103 that is above the extraction aperture 140 in the height direction. In other embodiments, the protrusion 150 is disposed on the portion of the extraction plate 103 that is below the extraction aperture 140 in the height direction.

In other embodiments, such as that shown in FIG. 5B, the thickness of the protrusion 150 on the portion of the extraction plate 103 that is above the extraction aperture 140 may differ from the thickness of the protrusion 150 on the portion of the extraction plate 103 that is below the extraction aperture 140. In certain embodiments, the thicker protrusion may be above the extraction aperture 140, while in other embodiments, the thicker protrusion may be below the extraction aperture 140.

Figure 6A:
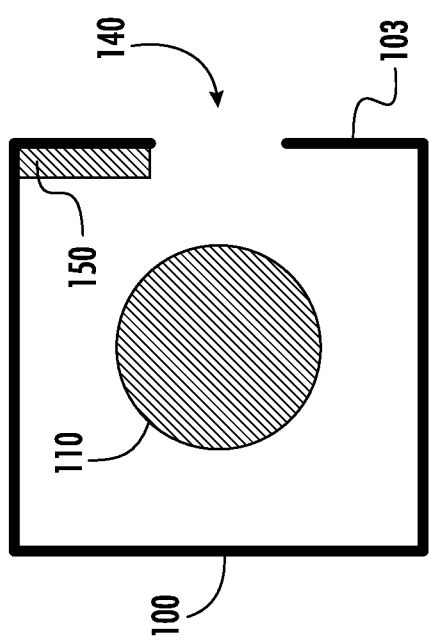
FIGS. 6A-6B are cross-sectional views of an IHC ion source according to different embodiments.
Figure 6B:
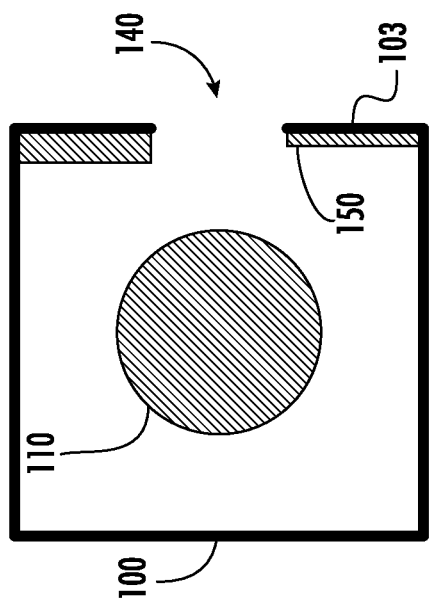

Additionally, FIGS. 4A-4D and 5A-5B show that, with the exception of the area around the extraction aperture 140, for a particular width position, the thickness of the extraction plate 103 is constant for all values of height. In other words, at a certain position in the X direction, the thickness of the extraction plate 103 is constant for all values of Y, except in the vicinity of the extraction aperture 140. However, other embodiments are possible. For example, there may be a constant radius of curvature along the height direction, as shown in FIG. 6A. Alternatively, there may be a taper such that the thickness of the extraction plate 103 at the midpoint of the extraction aperture 140 in the height direction is greater than other locations in the height direction. Further, in certain embodiments, the protrusion 150 may be shaped as a fin, as shown in FIG. 6B. In this embodiment, the protrusion 150 may be rectangular in shape and disposed proximate the extraction aperture 140.

Figure 3D:
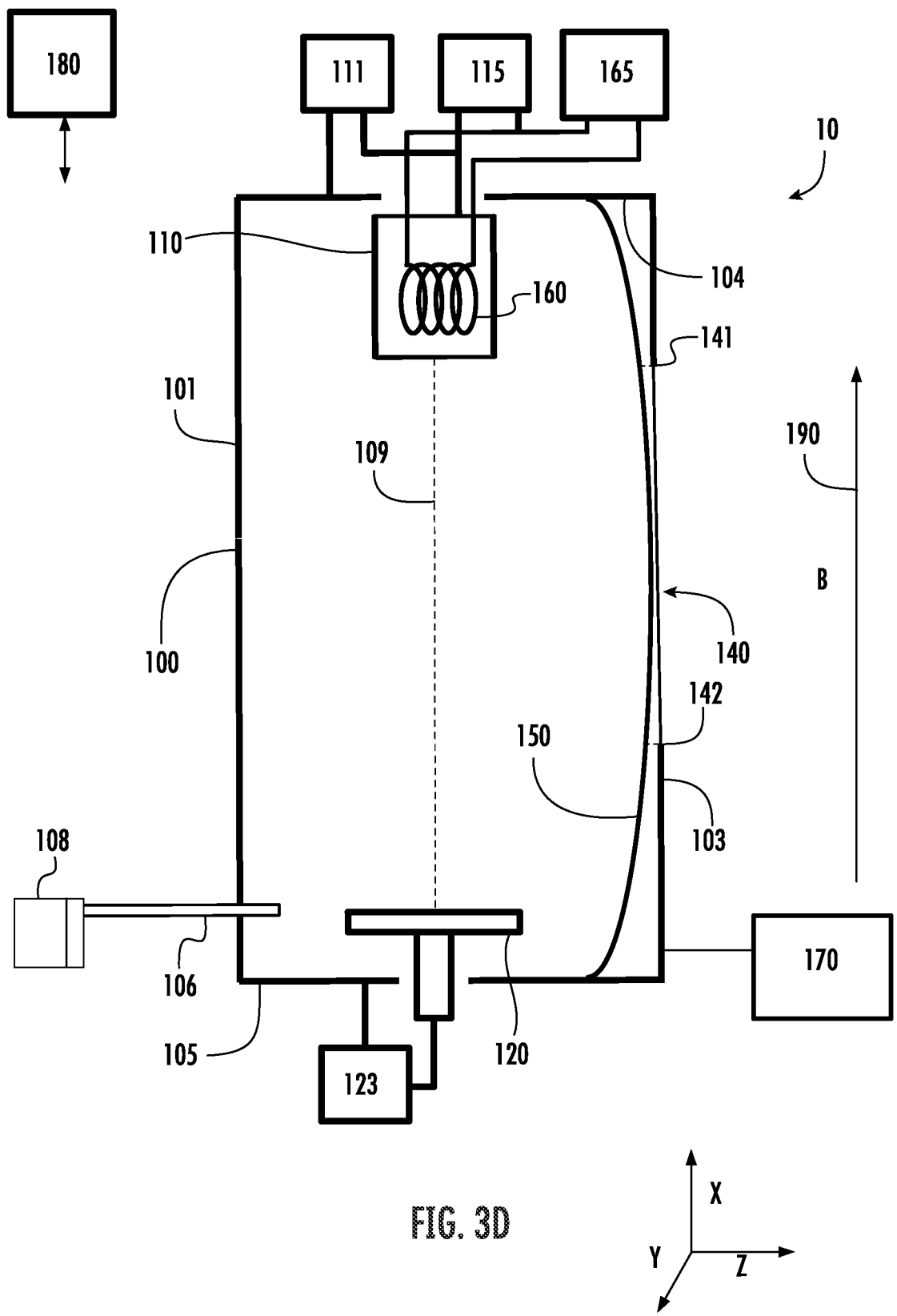

Further, while FIGS. 1 and 3A-3C show the maximum thickness of the protrusion 150 occurring at the center of the extraction aperture 140, other embodiments are also possible. For example, the maximum thickness of the protrusion 150 may occur proximate the first end 104 and/or the second end 105, as shown in FIG. 3D. This may be beneficial if the ion source generates higher plasma densities near the ends.

Figure 3E:
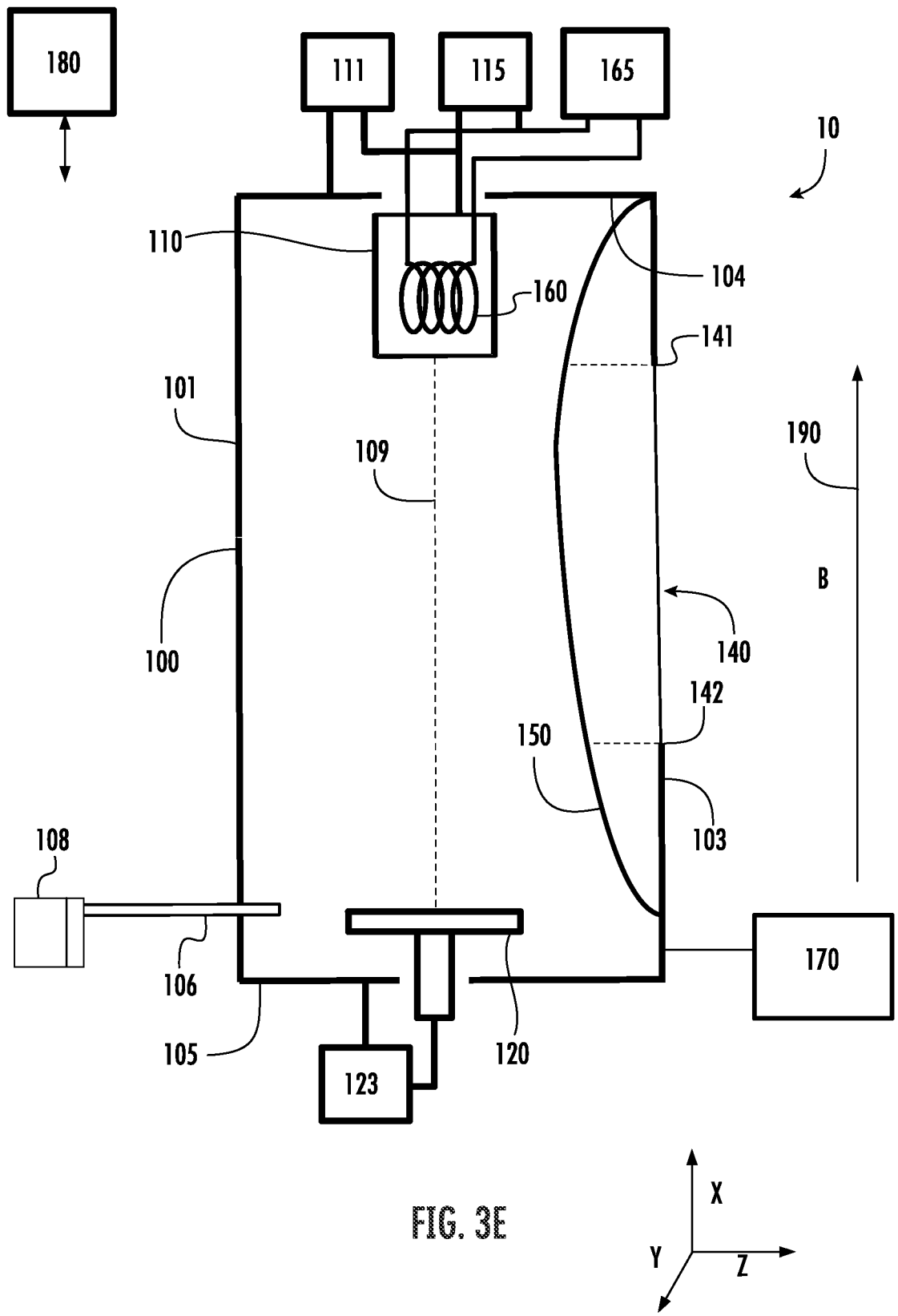

Additionally, all of the figures show the protrusion 150 being symmetrical about the center of the extraction aperture 140. However, other embodiments are also possible. For example, the plasma density within the ion source may be distributed such that the density near the first end 104 is greater than the density near the second end 105. In this case, the maximum (or minimum) thickness of the protrusion may occur closer to the first end 104 than to the second end 105, as shown in FIG. 3E.

Further, the protrusion 150 may not be symmetrical. Rather, the thickness of the protrusion 150 may vary in the X direction in any desired pattern.

The previous embodiments and figures all show and describe the protrusion 150 as being on the interior surface 145 of the extraction plate 103. However, other embodiments are also possible. For example, as explained above, it is the thickness of the extraction plate 103 in the Z direction that determines the loss area. Thus, any mechanism that increases the thickness of the extraction aperture 140 will affect the loss area and the ion density that is extracted.

Figure 7:
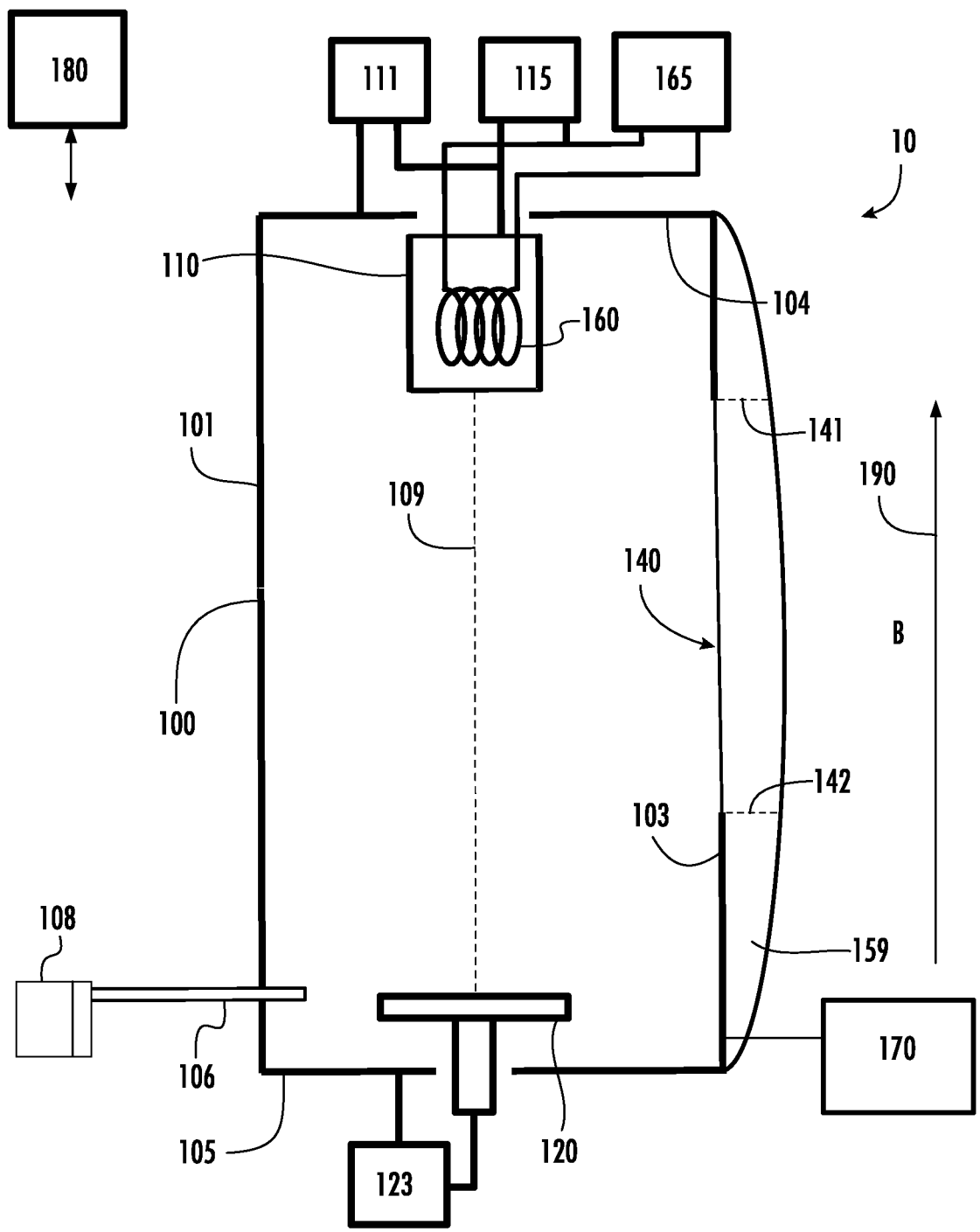
FIG. 7 shows a block diagram showing an IHC ion source where the protrusion is on the exterior surface.

Thus, in certain embodiments, such as that shown in FIG. 7, the protrusion may be disclosed on the exterior surface 146 of the extraction plate 103. In certain embodiments, the maximum difference between the thinnest part of the extraction plate 103 and the thickest part of the extraction plate may be between 1 and 5 mm. In other words, the protrusion may extend outward from the exterior surface by at least 1 mm. Of course, other dimensions may be used in other embodiments. In these embodiments, the thickness of the extraction aperture 140, through which the ions pass, may vary.

Further, while FIG. 7 shows an exterior protrusion 159 with a constant radius of curvature from the first end 104 to the second end 105, any of the shapes described herein may be used with the exterior protrusion 159. For example, the exterior protrusion 159 may be triangular or trapezoidal as shown in FIGS. 3B-3C. Further, the exterior protrusion 159 may be not extend from the first end 104 to the second end 105, as shown in FIG. 3A. Additionally, the exterior protrusion 159 may be asymmetrical in the width direction, as shown in FIG. 3E. The exterior protrusion 159 may be thicker at the ends, as shown in FIG. 3D. Additionally, the extraction aperture 140 may be tapered in the height direction, as shown in FIG. 4B, or not tapered, as shown in FIG. 4D. The exterior protrusion 159 may be asymmetric in the height direction, as shown in FIGS. 5A-5B. The exterior protrusion 159 may have a constant radius of curvature in the height direction, as shown in FIG. 6A, or may be shaped as fins, as shown in FIG. 6B.

The above describes the ion source as being an IHC ion source. However, other ion sources may also be used with this extraction plate 103. For example, magnetized DC plasma sources, tubular cathode source, Bernas ion source and inductively coupled plasma (ICP) ion sources may also use this extraction plate 103 with the protrusion 150. For example, if an inductively coupled plasma (ICP) ion source is used, one of the walls 101 may be made of a dielectric material such that RF energy from an external antenna may pass into the chamber 100. Thus, the extraction plate may be used with an ion source having a variety of different plasma generators.

Further, while the walls 101 are described as being electrically conductive, it is understood that liners, which may be non-conductive, may be disposed against the interior surface of the walls 101.

The present system and method have many advantages. Without being bound to a particular theory, it is believed that some of the ions that are being extracted from the chamber 100 become neutralized through contact with the extraction plate 103. In other words, the surfaces of the extraction aperture 140 serve as a loss area for ions as they are being extracted. The number or percentage of ions that are neutralized may be a function of the distance that the ions travel through the extraction aperture 140. Thus, by making the extraction plate 103 thicker in some regions, the loss area is increased and therefore, the number of ions that are neutralized is increased.

For example, the ion density of the extracted ion beam proximate a thin portion of the extraction aperture may be reduced by a first percentage, such as 50%. However, the ion density of the extracted ion beam proximate a thick portion of the extraction aperture may be reduced by a second percentage, larger than the first percentage, such as 75%. By introducing a protrusion on the extraction plate 103, the distance that the ions traverse while being extracted through the extraction aperture may be modified. The protrusion serves as a sink for free electrons and ions. This reduces the ion density in the extraction aperture proximate the protrusion 150.

In other words, although it is believed that the plasma density may be greater near the center of the extraction aperture 140, by increasing the thickness of the extraction aperture 140 in this region, the total number of ions that are extracted from this region may be reduced. Further, if the extraction current as a function of width is known, it may be possible to properly shape the protrusion 150 to increase the loss area along the extraction aperture 140 appropriately across the width such that the extracted ion beam current is nearly constant along the width direction.

In one test, the beam current was measured at the center of the extraction aperture 140, at a first point that is 1 inch to the left of center along the X direction and a second point that is 1 inch to the right of center along the X direction. Arsenic gas was introduced into the IHC ion source 10 and ionized. The extraction power supply 170 was biased at 35 kV. With an unmodified extraction aperture, the beam current at the first point was about 90% of the beam current at the center, while the beam current at the second point was about 80% of the beam current at the center.

Next, an extraction plate with a protrusion 150 having a constant radius of curvature and extending about 4 mm into the chamber 100 was installed. The above experiment was repeated and the beam current at the first point was nearly identical to the beam current at the center, while the beam current at the second point was about 90% of the beam current in the center. This represents an improvement in uniformity of about 50%.

In a second test, phosphorus gas was introduced into the IHC ion source and ionized. The extraction power supply 170 was biased at 35 kV. With an unmodified extraction aperture, the beam current at the first point was about 93% of the beam current at the center, while the beam current at the second point was about 67% of the beam current at the center.

Next, the extraction described above was installed and the above experiment was repeated. The beam current at the first point was nearly identical to the beam current at the center, while the beam current at the second point was about 75% of the beam current in the center. This represents an improvement in uniformity of about 30%.

Additional tests were performed that showed an improvement of between 20% and 50% in ribbon ion beam uniformity as compared to a traditional extraction plate.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. An ion source, comprising:
a chamber comprising a first end, a second end and a plurality of walls connecting the first end and the second end, wherein one of the plurality of walls is an extraction plate having an extraction aperture having a width greater than its height; and
a plasma generator to generate a plasma within the chamber;
wherein the extraction plate comprises a protrusion extending from an interior surface of the extraction plate at least 1 mm at at least one location such that a thickness of the extraction aperture varies as a function of the width of the extraction aperture.

2. The ion source of claim 1, wherein the protrusion comprises a constant radius of curvature from the first end to the second end.

3. The ion source of claim 1, wherein the protrusion comprises a triangular shape.

4. The ion source of claim 1, wherein the protrusion comprises a trapezoidal shape.

5. The ion source of claim 1, wherein a maximum thickness of the protrusion occurs at a center of the extraction aperture in a width direction.

6. The ion source of claim 1, wherein the extraction aperture passes through the protrusion, and edges of the extraction aperture are tapered in a height direction such that a height of the extraction aperture inside the chamber is larger than the height of the extraction aperture at an exterior surface of the extraction plate.

7. The ion source of claim 1, wherein the extraction aperture passes through the protrusion, and edges of the extraction aperture are such that a height of the extraction aperture inside the chamber is equal to the height of the extraction aperture at an exterior surface of the extraction plate.

8. The ion source of claim 1, wherein the protrusion above the extraction aperture in a height direction has a different thickness than the protrusion below the extraction aperture in the height direction.

9. The ion source of claim 1, wherein the protrusion is only disposed on one side of the extraction aperture in a height direction.

10. The ion source of claim 1, wherein the plasma generator comprises an indirectly heated cathode disposed at the first end.

11. An extraction plate for use with an ion source, comprising:
an interior surface adapted to be within a chamber, an exterior surface and an extraction aperture having a width greater than its height;
wherein the extraction plate comprises a protrusion extending from an interior surface of the extraction plate at least 1 mm at at least one location such that a thickness of the extraction aperture varies as a function of the width of the extraction aperture.

12. The extraction plate of claim 11, wherein a maximum thickness of the protrusion occurs at a center of the extraction aperture in a width direction.

13. The extraction plate of claim 11, wherein the extraction aperture passes through the protrusion, and edges of the extraction aperture are tapered in a height direction such that a height of the extraction aperture inside the chamber is larger than the height of the extraction aperture at an exterior surface of the extraction plate.

14. The extraction plate of claim 11, wherein the extraction aperture passes through the protrusion, and edges of the extraction aperture are such that a height of the extraction aperture inside the chamber is equal to the height of the extraction aperture at the exterior surface of the extraction plate.

15. The extraction plate of claim 11, wherein the protrusion above the extraction aperture in a height direction has a different thickness than the protrusion below the extraction aperture in the height direction.

16. The extraction plate of claim 11, wherein the protrusion is only disposed on one side of the extraction aperture in a height direction.

17. An extraction plate for use with an ion source, comprising:
an interior surface adapted to be within a chamber, an exterior surface and an extraction aperture having a width greater than its height;
wherein the extraction plate comprises a protrusion extending outward from an exterior surface of the extraction plate at least 1 mm at at least one location such that a thickness of the extraction aperture varies as a function of the width of the extraction aperture.

18. An ion source, comprising:
a chamber comprising a first end, a second end and a plurality of walls connecting the first end and the second end, wherein one of the plurality of walls is the extraction plate of claim 17; and
a plasma generator to generate a plasma within the chamber.

19. The ion source of claim 18, wherein the protrusion comprises a constant radius of curvature from the first end to the second end.

20. The ion source of claim 18, wherein the protrusion comprises a triangular shape.

21. The ion source of claim 18, wherein the protrusion comprises a trapezoidal shape.

22. The ion source of claim 18, wherein a maximum thickness of the protrusion occurs at a center of the extraction aperture in a width direction.

23. The ion source of claim 18, wherein the extraction aperture passes through the protrusion, and edges of the extraction aperture are tapered in a height direction such that a height of the extraction aperture inside the chamber is larger than the height of the extraction aperture at an exterior surface of the extraction plate.

24. The ion source of claim 18, wherein the extraction aperture passes through the protrusion, and edges of the extraction aperture are such that a height of the extraction aperture inside the chamber is equal to the height of the extraction aperture at an exterior surface of the extraction plate.

25. The ion source of claim 18, wherein the protrusion above the extraction aperture in a height direction has a different thickness than the protrusion below the extraction aperture in the height direction.

26. The ion source of claim 18, wherein the protrusion is only disposed on one side of the extraction aperture in a height direction.

27. The ion source of claim 18, wherein the plasma generator comprises an indirectly heated cathode disposed at the first end.

28. An ion implantation system, comprising:
an ion source to generate an ion beam; and
one or more beamline components to direct the ion beam toward a workpiece;
wherein the ion source comprises:
a chamber comprising a first end, a second end and a plurality of walls connecting the first end and the second end, wherein one of the plurality of walls is an extraction plate having an extraction aperture having a width greater than its height; and
a plasma generator to generate a plasma within the chamber;
wherein the extraction plate comprises a protrusion extending from an interior surface of the extraction plate at least 1 mm at at least one location such that a thickness of the extraction aperture varies as a function of the width of the extraction aperture.

* * * * *